(12) United States Patent
Botula et al.

(10) Patent No.: US 8,963,293 B2
(45) Date of Patent: Feb. 24, 2015

(54) HIGH RESISTIVITY SILICON-ON-INSULATOR SUBSTRATE AND METHOD OF FORMING

(71) Applicant: International Business Machines Corporation, Armonk, NY (US)

(72) Inventors: Alan B. Botula, Essex Junction, VT (US); Mark D. Jaffe, Shelburne, VT (US); Alvin J. Joseph, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/151,582

(22) Filed: Jan. 9, 2014

(65) Prior Publication Data

US 2014/0124902 A1 May 8, 2014

Related U.S. Application Data

(62) Division of application No. 13/342,697, filed on Jan. 3, 2012, now Pat. No. 8,741,739.

(51) Int. Cl.
*H01L 23/58* (2006.01)
*H01L 29/16* (2006.01)
*H01L 21/762* (2006.01)

(52) U.S. Cl.
CPC .......... *H01L 29/16* (2013.01); *H01L 21/76254* (2013.01)
USPC ............ 257/623; 257/E23.002; 257/E21.567; 438/455; 438/478

(58) Field of Classification Search
CPC .............. H01L 29/16; H01L 21/76264; H01L 27/1207

USPC ................... 257/632, E23.002; 438/455, 478
See application file for complete search history.

(56) References Cited

U.S. PATENT DOCUMENTS

| 5,376,579 A | 12/1994 | Annamalai |
| 5,855,693 A | 1/1999 | Murari et al. |
| 6,743,662 B2 | 6/2004 | Fathimulla et al. |
| 7,781,256 B2 | 8/2010 | Sung |
| 7,883,990 B2 | 2/2011 | Levy et al. |
| 7,977,705 B2 | 7/2011 | Nguyen et al. |

(Continued)

FOREIGN PATENT DOCUMENTS

JP         6132184 A    5/1994

OTHER PUBLICATIONS

U.S. Appl. No. 13/342,697, Office Action dated Aug. 6, 2013.

(Continued)

*Primary Examiner* — Elias M Ullah
(74) *Attorney, Agent, or Firm* — Michael J. LeStrange; Hoffman Warnick LLC

(57) ABSTRACT

A semiconductor structure and a method of forming the same. In one embodiment, a method of forming a silicon-on-insulator (SOI) wafer substrate includes: providing a handle substrate; forming a high resistivity material layer over the handle substrate, the high resistivity material layer including one of an amorphous silicon carbide (SiC), a polycrystalline SiC, an amorphous diamond, or a polycrystalline diamond; forming an insulator layer over the high resistivity material layer; and bonding a donor wafer to a top surface of the insulator layer to form the SOI wafer substrate.

8 Claims, 6 Drawing Sheets

SOI wafer substrate 18

| Remaining portion of donor wafer 8 | Donor substrate 10 |
| | Donor insulator 12 |
| | Insulator layer 6 |
| | High resistivity layer 4 |
| | Handle substrate 2 |

(56) References Cited

U.S. PATENT DOCUMENTS

2006/0284167 A1 12/2006 Augustine et al.
2009/0026438 A1 1/2009 Lin
2009/0321747 A1 12/2009 Murphy et al.
2009/0321873 A1 12/2009 Nguyen et al.
2011/0186959 A1 8/2011 Jerome et al.

OTHER PUBLICATIONS

U.S. Appl. No. 13/342,697, Notice of Allowance dated Jan. 27, 2014.

HIGH RESISTIVITY SILICON-ON-INSULATOR SUBSTRATE AND METHOD OF FORMING

CROSS-REFERENCE TO RELATED APPLICATION

This application is a divisional application of co-pending U.S. patent application Ser. No. 13/342,697, filed Jan. 3, 2012, which is hereby incorporated herein in its entirety.

FIELD

The subject matter disclosed herein relates to a silicon-on-insulator based semiconductor structure. More specifically, the subject matter disclosed herein relates to a semiconductor structure having a silicon-on-insulator substrate with a high resistivity.

BACKGROUND

In certain semiconductor devices, such as semiconductor-on-insulator (SOI) radio frequency (RF) devices, resistivity in the handle substrate can impact performance of the device. An example of such a device is a SOI RF complementary metal oxide semiconductor (CMOS) device. In these SOI RF devices, free carriers in the handle substrate are susceptible to movement caused by the electric fields created by potentials on the transistors and wires. The movement of carriers is generally non-linear, and this non-linear "drag" both lowers the charge (Q) of passive components and creates nonlinearities in electrical characteristics. The handle substrate also functions as a path for heat removal from the active devices, and thus the handle substrate generally has a high thermal conductivity. Conventional fabrication techniques to form semiconductor devices fail to address these concerns.

BRIEF SUMMARY

A semiconductor structure and a method of forming the same are disclosed. In one embodiment, a method of forming a silicon-on-insulator (SOI) wafer substrate is disclosed, the method including: providing a handle substrate; forming a high resistivity material layer over the handle substrate, the high resistivity material layer including one of an amorphous silicon carbide (SiC), a polycrystalline SiC, an amorphous carbon, an amorphous diamond, or a polycrystalline diamond; forming an insulator layer over the high resistivity material layer; and bonding a donor wafer to a top surface of the insulator layer to form the SOI wafer substrate.

A first aspect includes a method of forming a silicon-on-insulator (SOI) wafer substrate, the method including: providing a handle substrate; forming a high resistivity material layer over the handle substrate, the high resistivity material layer including one of an amorphous silicon carbide (SiC), a polycrystalline SiC, an amorphous carbon, an amorphous diamond, or a polycrystalline diamond; forming an insulator layer over the high resistivity material layer; and bonding a donor wafer to a top surface of the insulator layer to form the SOI wafer substrate.

A second aspect includes a silicon-on-insulator (SOI) wafer substrate having: a handle substrate; a high resistivity material layer overlying the handle substrate, the high resistivity material layer including one of an amorphous silicon carbide (SiC), a polycrystalline SiC, an amorphous carbon, an amorphous diamond, or a polycrystalline diamond; an insulator layer over the high resistivity material layer; and a donor wafer over a top surface of the insulator layer.

A third aspect includes a method of forming a silicon-on-insulator (SOI) wafer substrate, the method comprising: providing a handle substrate including silicon; depositing a high resistivity material layer over the handle substrate, the high resistivity material layer including one of an amorphous silicon carbide (SiC), a polycrystalline SiC, an amorphous carbon, an amorphous diamond, or a polycrystalline diamond; depositing an insulator layer over the high resistivity material layer; and bonding a donor wafer to a top surface of the insulator layer to form the SOI wafer substrate.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

Figure 1:
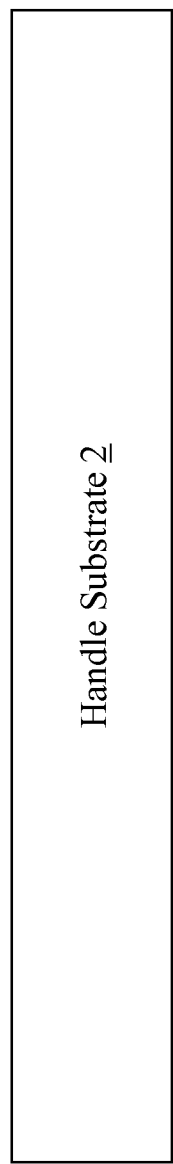
FIG. 1 illustrates a process in a method of forming a silicon-on-insulator (SOI) structure according to embodiments of the invention.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As noted herein, the subject matter disclosed relates to a silicon-on-insulator based integrated circuit structure. More specifically, the subject matter disclosed herein relates to an integrated circuit structure having a silicon-on-insulator substrate with a high resistivity.

In certain semiconductor devices, such as semiconductor-on-insulator (SOI) radio frequency (RF) devices, resistivity in the handle substrate can impact performance of the device. An example of such a device is a SOI RF complementary metal oxide semiconductor (CMOS) device. In these SOI RF devices, electric potentials on transistors and wires create electric fields, which in turn can cause movement of free carriers in the handle substrate. The movement of carriers is generally non-linear, and this non-linear "drag" both lowers the charge (Q) of passive components and creates nonlinearities in electrical characteristics. The handle substrate also acts as a path for heat removal from the active devices, and thus the handle substrate generally has a high thermal conductivity. It is for this reason that conventional insulators like thick $SiO_2$ are generally not used for handle substrates. As described herein, conventional fabrication techniques to form semiconductor devices fail to address these concerns.

In contrast to conventional approaches, aspects of the invention provide for a silicon-on-insulator (SOI) device having a substrate with a high resistivity. In particular, aspects of the invention provide for an SOI device having a high band-gap (low carrier density), low-mobility material between the handle substrate and an overlying silicon dioxide layer. This high band-gap material is also a good thermal conductor. The high band-gap material can include an amorphous or polycrystalline material with a relatively high resistivity, which can be deposited over a handle substrate such as a silicon-based handle substrate. Following formation of the high band-gap material over the handle substrate, an insulator such as silicon dioxide (SiO2) can be formed over the high band-gap material, and additional silicon layer(s) may be formed over the insulator layer for the purpose of fabricating devices such as SOI RF devices (e.g., CMOS devices).

Turning to the drawings, FIGS. 1-5 illustrate portions of a method of forming a SOI structure (e.g., wafer substrate) according to embodiments. Turning more specifically to FIG. 1, a first processes includes providing a handle substrate 2. The handle substrate 2 can include silicon in some embodiments, and in some cases, can be comprised primarily of silicon. The handle substrate 2 can be formed of a substantially low or nominal-resistivity material, e.g., a material having a resistivity of approximately 50-1000 ohms-centimeter. The handle substrate 2 can be formed by any conventional fabrication techniques including crystal pulling, deposition, epitaxial growth, spin-application, etc. In any case, the handle substrate 2 can be formed according to conventional SOI techniques, the descriptions of which are omitted herein for clarity of invention.

In some cases, the handle substrate 2 includes but is not limited to silicon, germanium, silicon germanium, silicon carbide, and those materials consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate may be strained.

Figure 2:
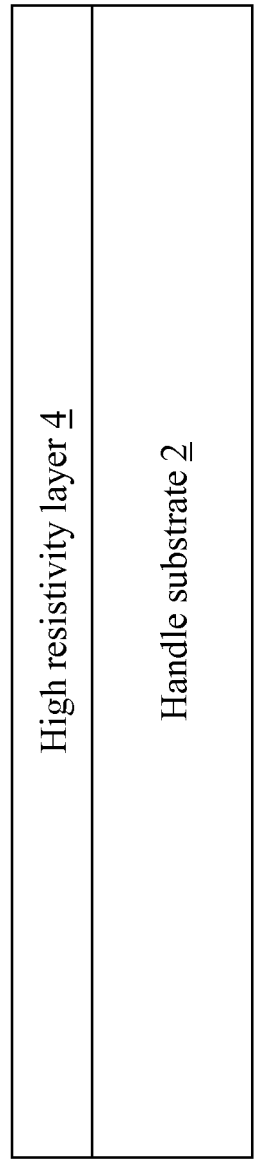
FIG. 2 illustrates a process in a method of forming a (SOI) structure according to embodiments of the invention.

FIG. 2 illustrates another process in a method according to embodiments, the process including forming a high resistivity material layer 4 over the handle substrate 2 (e.g., directly contacting the handle substrate 2). This "high resistivity" material can have a resistivity substantially greater than that of the handle substrate 2, and in some cases can be approximately 4,000-5,000 ohms-centimeter. In some cases, the high resistivity material 4 can include at least one of an amorphous silicon carbide (SiC), a polycrystalline SiC, an amorphous carbon (C) an amorphous diamond, or a polycrystalline diamond. In some embodiments, the high resistivity material 4 is deposited over the handle substrate 2, and in some cases, the high resistivity material 4 is deposited directly on the handle substrate 2. In some embodiments, the high resistivity material 4 is deposited using conventional deposition techniques (e.g., chemical vapor deposition (CVD)) and is deposited to a thickness of approximately 10-50 micrometers (um). As noted above, the deposition can be performed amorphously, at a temperature that may vary depending upon the material composition of the high resistivity layer 4. In the case that the high resistivity layer 4 includes SiC, the layer can be deposited by CVD at a temperature below approximately 2,730 degrees Celsius. In the case that the high resistivity layer 4 includes carbon, the layer can be deposited by CVD at a temperature below approximately 3,500 degrees Celsius.

In any case, "depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 3:
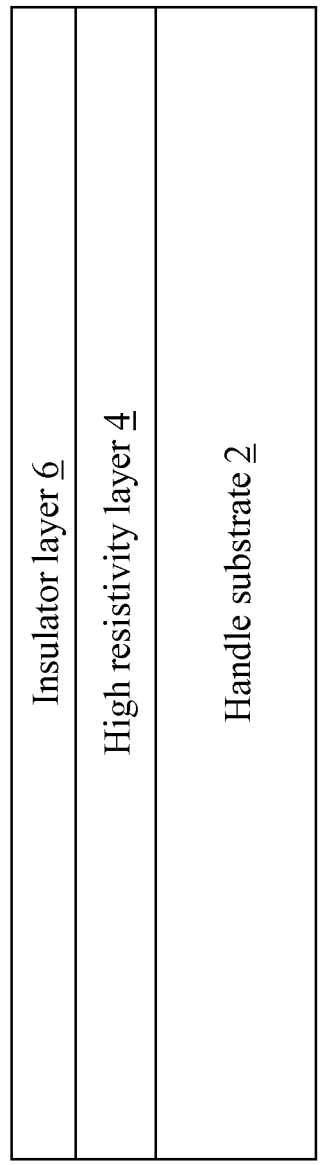
FIG. 3 illustrates a process in a method of forming a (SOI) structure according to embodiments of the invention.

FIG. 3 illustrates another process in a method according to embodiments, the process including forming an insulator layer 6 over the high resistivity layer 4. In one embodiment, the insulator layer 6 includes a conventional SOI device insulator such as silicon dioxide (SiO2) or glass (e.g., boro-phospho-silicate glass (BPSG)). The insulator layer 6 can be deposited over the high resistivity layer 4 in some embodiments, and may be deposited via any conventional methods described herein and/or known in the art.

Figure 4:
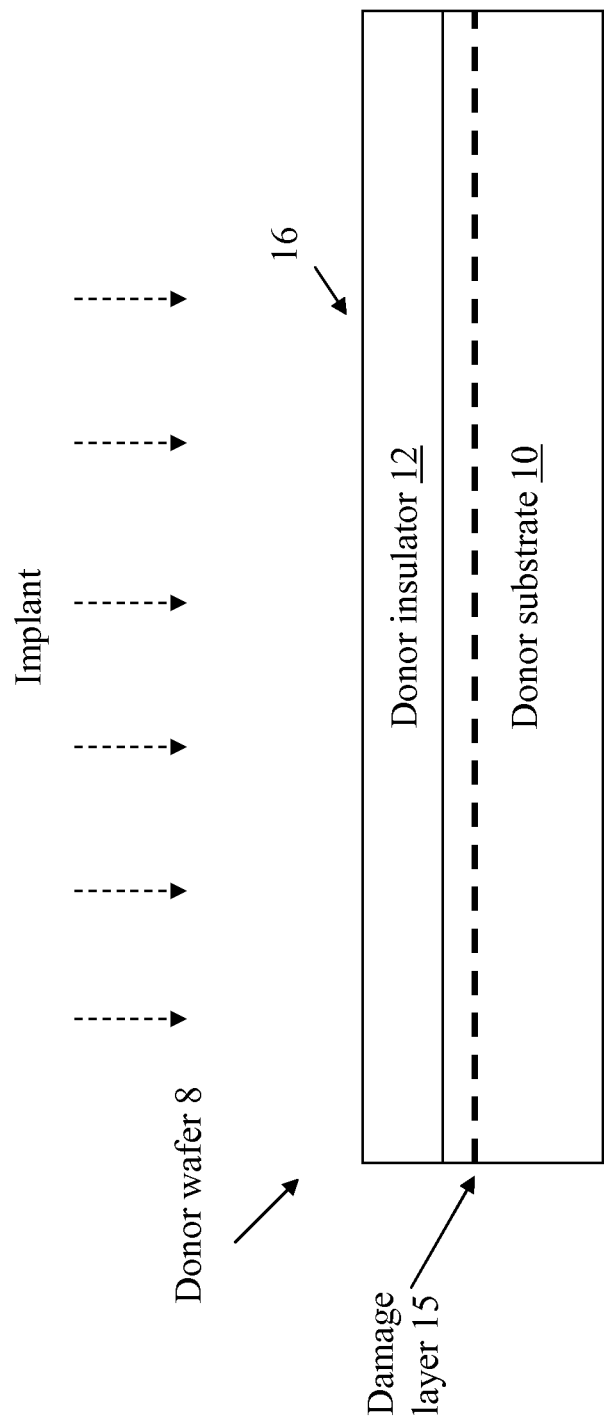
FIG. 4 illustrates a process in a method of forming a (SOI) structure according to embodiments of the invention.

FIG. 4 illustrates an optional process in a method according to embodiments, the process including providing a conventional donor wafer 8, including a donor substrate 10 (including silicon) and a donor insulator 12 in contact with the donor substrate 10. The donor insulator 12 can include a conventional donor wafer insulator, e.g., silicon dioxide (SiO2). The donor insulator 12 can be formed over the donor substrate 10 via conventional methods described herein, e.g., deposition. The donor wafer 8, including the donor insulator 12 and donor substrate 10, can then be implanted (indicated by dashed arrows), e.g., with hydrogen in conventional techniques, to form a layer of crystal damage (or damaged layer) 15, indicated by a dashed line extending within donor substrate 10. The crystal damaged layer 15 can define a cleaving line for later cleaving (separation) from remaining portions of the donor wafer 8 as described herein.

Figure 5:
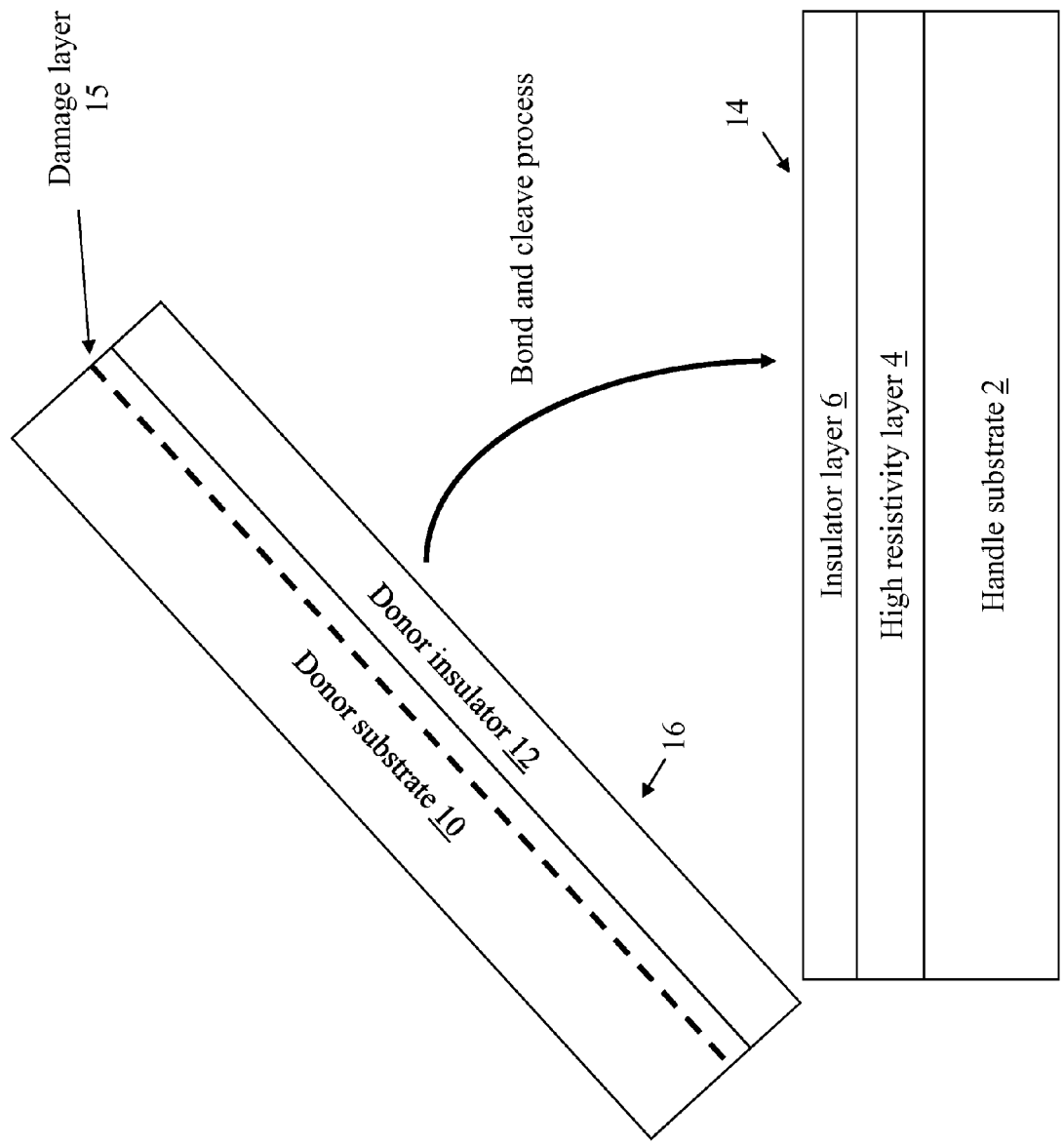
FIG. 5 illustrates a process in a method of forming a (SOI) structure according to embodiments of the invention.
Figure 6:
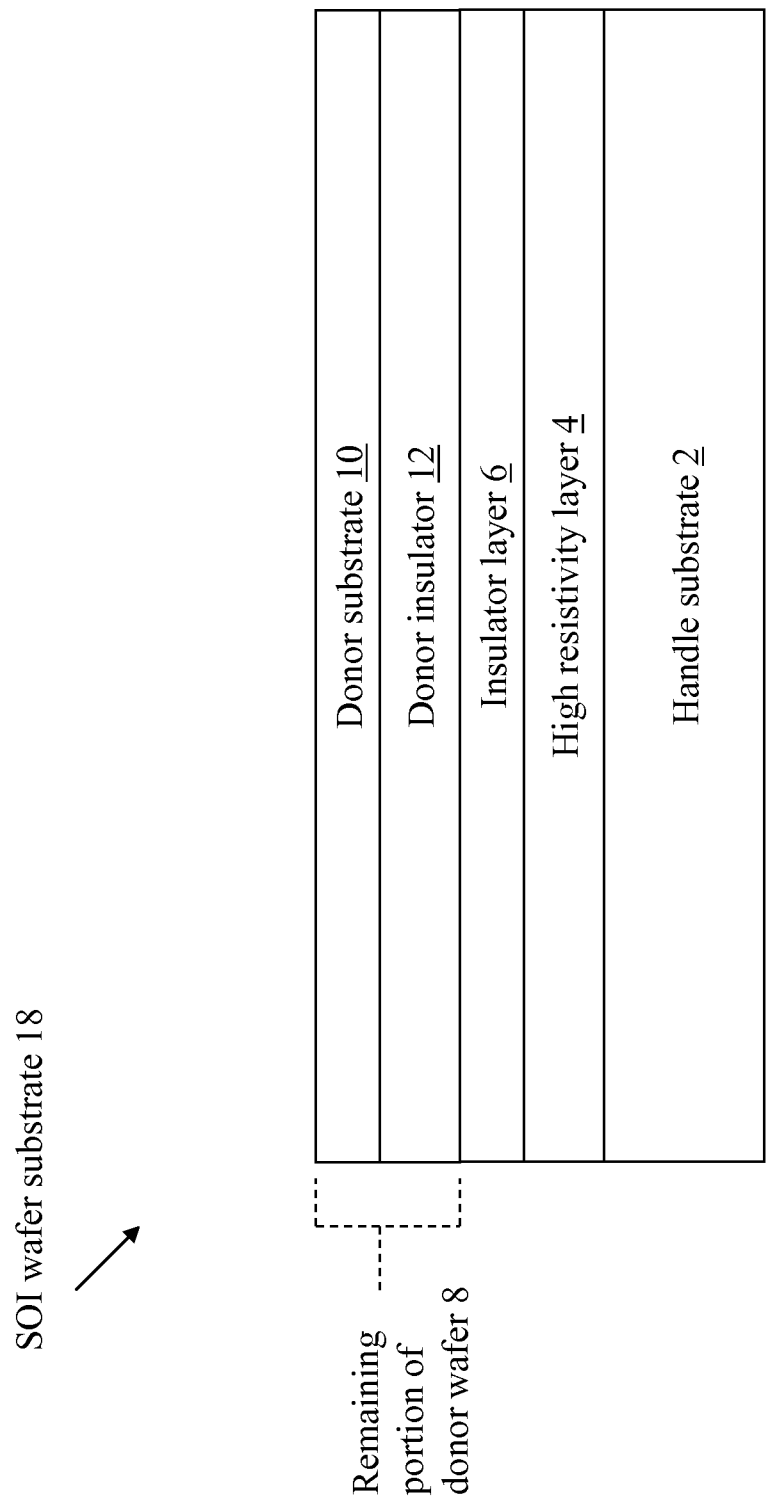
FIG. 6 shows a side schematic view of a SOI structure according to embodiments of the invention.

FIG. 5 illustrates a process in a method according to embodiments, the process including bonding the donor wafer 8 to a top surface 14 of the insulator layer 6 to form an SOI wafer substrate (FIG. 6). As shown, in this process, the donor wafer 8 is inverted such that a top surface 16 of the donor insulator 12 faces the top surface 14 of the insulator layer 6. The donor wafer 8 is then placed on the insulator layer 6 such that the top surfaces 14, 16 contact one another. Subsequently, the donor wafer 8 is bonded to the top surface 14 of the insulator (e.g., via conventional annealing). This anneal can cause the donor wafer 8 to cleave (or separate) at the damage layer 15, indicated by dashed line in donor wafer 8. The portion of the donor wafer 8 above the damage layer 15 (e.g., a portion of the donor substrate 10), can be removed and discarded after the final bonding of the donor wafer 8 to the top surface 14 of the insulator layer 6. As is shown and described with reference to FIG. 6, after cleaving, the donor insulator 12 remains in tact, and a portion of the donor substrate 10 remains in the final SOI wafer substrate.

FIG. 6 illustrates a SOI wafer substrate 18 according to embodiments of the invention, which may be formed according to the processes outlined with respect to one or more of FIGS. 1-5 herein. As shown, the SOI wafer substrate 18 can include: the handle substrate 2; the high resistivity layer 4 overlying the handle substrate 2; the insulator layer 6 over the high resistivity layer 4, and the remaining portion of donor wafer 8 (including the portion of the donor substrate 10 not cleaved with the damaged layer 15, and the donor insulator 12) over a top surface (FIG. 5, numeral 14) of the insulator layer 6.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

We claim:

1. A silicon-on-insulator (SOI) wafer substrate, comprising:
    a handle substrate;
    a high resistivity material layer overlying the handle substrate, the high resistivity material layer including one of an amorphous carbon, an amorphous diamond, or a polycrystalline diamond;
    an insulator layer over the high resistivity material layer, wherein the insulator layer includes boro-phospho-silicate glass (BPSG); and
    a donor wafer over a top surface of the insulator layer, wherein the donor wafer directly contacts the insulator layer, wherein the donor wafer includes:
        a donor substrate; and
        a donor insulator layer contacting the donor substrate.

2. The SOI wafer substrate of claim 1, wherein the handle substrate is comprised primarily of silicon.

3. The SOI wafer substrate of claim 1, wherein the high resistivity layer directly contacts the handle substrate.

4. The SOI wafer substrate of claim 1, wherein the high resistivity layer is approximately 10-50 micrometers thick.

5. The SOI wafer substrate of claim 1, wherein the handle substrate has a resistivity of approximately 50-1000 ohms-centimeter.

6. A method of forming a silicon-on-insulator (SOI) wafer substrate, the method comprising:
    depositing a high resistivity material layer directly on a handle substrate including silicon, the high resistivity material layer including an amorphous carbon, the depositing of the high resistivity material layer including performing a chemical vapor deposition (CVD) of the amorphous carbon at a temperature below approximately 3,500 degrees Celsius at a thickness of approximately 10-50 micrometers;
    depositing an insulator layer over the high resistivity material layer; and
    bonding a donor wafer to a top surface of the insulator layer to form the SOI wafer substrate.

7. The method of claim 6, wherein the insulator layer includes at least one of silicon dioxide (SiO2) or boro-phospho-silicate glass (BPSG).

8. The method of claim 6, wherein the donor wafer includes:
    a donor substrate; and
    a donor insulator layer contacting the donor substrate,
    wherein the bonding of the donor wafer includes bonding the donor insulator layer directly to the top surface of the insulator layer.

\* \* \* \* \*